(12) United States Patent
Ben-Zedeff et al.

(10) Patent No.: US 8,612,819 B2
(45) Date of Patent: Dec. 17, 2013

(54) SYSTEMS, METHODS, AND MEDIA FOR CHECKING AVAILABLE BANDWIDTH USING FORWARD ERROR CORRECTION

(75) Inventors: Sagee Ben-Zedeff, Givatayim (IL); Yair Wiener, Herzliya (IL)

(73) Assignee: Radvision Ltd., Tel Aviv (IL)

( * ) Notice: Subject to any disclaimer, the term of this patent is extended or adjusted under 35 U.S.C. 154(b) by 367 days.

(21) Appl. No.: 12/547,134

(22) Filed: Aug. 25, 2009

(65) Prior Publication Data

US 2011/0055656 A1    Mar. 3, 2011

(51) Int. Cl.
    *G06F 11/00* (2006.01)
(52) U.S. Cl.
    USPC ................ 714/752; 333/178; 358/426.08
(58) Field of Classification Search
    USPC ................ 714/752; 333/178; 358/426.08
    See application file for complete search history.

(56) References Cited

U.S. PATENT DOCUMENTS

| | | | | |
|---|---|---|---|---|
| 6,044,107 A * | 3/2000 | Gatherer et al. | ............ | 375/222 |
| 6,947,490 B1 * | 9/2005 | Edwards et al. | ............ | 375/261 |
| 7,165,102 B2 * | 1/2007 | Shah et al. | ............ | 709/223 |
| 7,397,805 B2 * | 7/2008 | Gao et al. | ............ | 370/395.41 |
| 7,970,920 B1 * | 6/2011 | Dinan | ............ | 709/230 |
| 2002/0054578 A1 * | 5/2002 | Zhang et al. | ............ | 370/328 |
| 2002/0069038 A1 * | 6/2002 | Cooper | ............ | 702/191 |
| 2004/0015765 A1 * | 1/2004 | Cooper et al. | ............ | 714/750 |
| 2004/0233844 A1 * | 11/2004 | Yu et al. | ............ | 370/230 |
| 2004/0240415 A1 * | 12/2004 | Lane | ............ | 370/335 |
| 2007/0220403 A1 * | 9/2007 | Allen | ............ | 714/774 |
| 2007/0250639 A1 * | 10/2007 | Roullet et al. | ............ | 709/236 |
| 2007/0263540 A1 * | 11/2007 | Charzinski et al. | ............ | 370/232 |
| 2007/0263664 A1 * | 11/2007 | Yang | ............ | 370/477 |
| 2008/0130563 A1 * | 6/2008 | Xu et al. | ............ | 370/329 |
| 2008/0294598 A1 * | 11/2008 | Imai | ............ | 707/2 |
| 2009/0287964 A1 * | 11/2009 | Morris | ............ | 714/39 |
| 2010/0199152 A1 * | 8/2010 | Ver Steeg | ............ | 714/776 |
| 2011/0110260 A1 * | 5/2011 | Yoneda et al. | ............ | 370/252 |

* cited by examiner

*Primary Examiner* — Loan L. T. Truong

(57) ABSTRACT

Methods for checking available bandwidth using forward error correction are provided, the methods comprising: identifying data to be transmitted; determining an amount of forward error correction data to be sent to a receiver; creating the forward error correction data based on corresponding data in the data to be transmitted; transmitting to the receiver the forward error correction data and the corresponding data in the data to be transmitted; determining an error level in at least one of the corresponding data and the forward error correction data; and when the error level is below a value, increasing the amount of bandwidth used in a transmission to the receiver of other data in the data to be transmitted over the amount of bandwidth used in the transmission to the receiver of the corresponding data and decreasing the amount of bandwidth used for forward error correction data in the transmission of the other data.

19 Claims, 2 Drawing Sheets

SYSTEMS, METHODS, AND MEDIA FOR CHECKING AVAILABLE BANDWIDTH USING FORWARD ERROR CORRECTION

TECHNICAL FIELD

The disclosed subject matter relates to systems, methods, and media for checking available bandwidth using forward error correction.

BACKGROUND

Modern electronic applications and communication systems generally rely on the transmission of digital data from a sender to a receiver. Due to capacity and quality limitations in these networks and communication systems, a sender may need to limit the bandwidth being used in transmitting such digital data to a receiver in order to prevent the data from being damaged or lost. A sender may also need to limit the bandwidth being used in order to allow other senders to send data on the same networks and communication systems.

From time to time, however, it may be desirable for a sender to increase the bandwidth being used. For example, during a video conference, the available bandwidth between the sender and receiver may fluctuate depending on the usage of the network or due to a temporal variation of the network capacity. Once the bandwidth in use is reduced, the sender may want to return to the original or optimal bandwidth after a certain period of time. However, in networks commonly used today, it is not possible to know whether there has been an increase in available bandwidth and whether any such increase can be used by the application from a certain point in time on.

Because data being transmitted on a network or communication system may already be using all of the available bandwidth, increasing the bandwidth of a data transmission may result in lost data and a drop in the Quality of Experience enjoyed by the user of the session.

SUMMARY

In accordance with some embodiments, systems, methods, and media for checking available bandwidth using forward error correction are provided. In some embodiments, systems for checking available bandwidth using forward error correction are provided, the systems comprising: at least one processor that: identifies data to be transmitted; determines an amount of forward error correction data to be sent to a receiver; creates the forward error correction data based on corresponding data in the data to be transmitted; transmits to the receiver the forward error correction data and the corresponding data in the data to be transmitted; determines an error level in at least one of the corresponding data and the forward error correction data, and when the error level is below a value, increases the amount of bandwidth used in a transmission to the receiver of other data in the data to be transmitted over the amount of bandwidth used in the transmission to the receiver of the corresponding data and decreases the amount of bandwidth used for forward error correction data in the transmission of the other data.

In some embodiments, methods for checking available bandwidth using forward error correction are provided, the methods comprising: identifying data to be transmitted; determining an amount of forward error correction data to be sent to a receiver; creating the forward error correction data based on corresponding data in the data to be transmitted; transmitting to the receiver the forward error correction data and the corresponding data in the data to be transmitted; determining an error level in at least one of the corresponding data and the forward error correction data; and when the error level is below a value, increasing the amount of bandwidth used in a transmission to the receiver of other data in the data to be transmitted over the amount of bandwidth used in the transmission to the receiver of the corresponding data and decreasing the amount of bandwidth used for forward error correction data in the transmission of the other data.

In some embodiments, computer-readable media containing computer-executable instructions that, when executed by a processor, cause the processor to perform a method for checking available bandwidth using forward error correction, the method comprising: identifying data to be transmitted; determining an amount of forward error correction data to be sent to a receiver; creating the forward error correction data based on corresponding data in the data to be transmitted; transmitting to the receiver the forward error correction data and the corresponding data in the data to be transmitted; determining an error level in at least one of the corresponding data and the forward error correction data; and when the error level is below a value, increasing the amount of bandwidth used in a transmission to the receiver of other data in the data to be transmitted over the amount of bandwidth used in the transmission to the receiver of the corresponding data and decreasing the amount of bandwidth used for forward error correction data in the transmission of the other data.

DETAILED DESCRIPTION

In accordance with various embodiments, mechanisms for checking available bandwidth using forward error correction are provided. These mechanisms can be used in a variety of applications. For example, these mechanisms can be used in video conferencing systems, in telecommunication systems, in streaming systems, in computer network systems, in digital television systems, in cable systems, in satellite communication systems, in wireless communication networks, in local area networks, in wide area networks, on the Internet, on any other suitable network or communication systems, and/or on any combination of the same.

In accordance with some embodiments, available bandwidth on any suitable network path or communication system can be checked using forward error correction. For example, when a data transmission is using a first amount of bandwidth, increasing the bandwidth of the transmission may cause data to be lost due to the lack of availability of the necessary bandwidth resulting in quality problems in the transmission. By increasing the bandwidth being used with additional data that includes forward error correction data, however, data that might be lost due to such an increase in bandwidth can be repaired/reconstructed. In a some embodiments, forward error correction data created to check the availability of bandwidth can be combined with forward error correction data that existed in the stream beforehand so that this combination will have a bandwidth higher or equal to the bandwidth that is being checked for availability. The forward error correction data in the additional data is redundant bandwidth by design because this data represents data already being transmitted. Once an increased amount of bandwidth has been verified as not causing unacceptable transmission problems, the additional bandwidth can be re-allocated to the data (instead of forward error correction data) and the effective bandwidth used for the data transmission increased.

Figure 1:
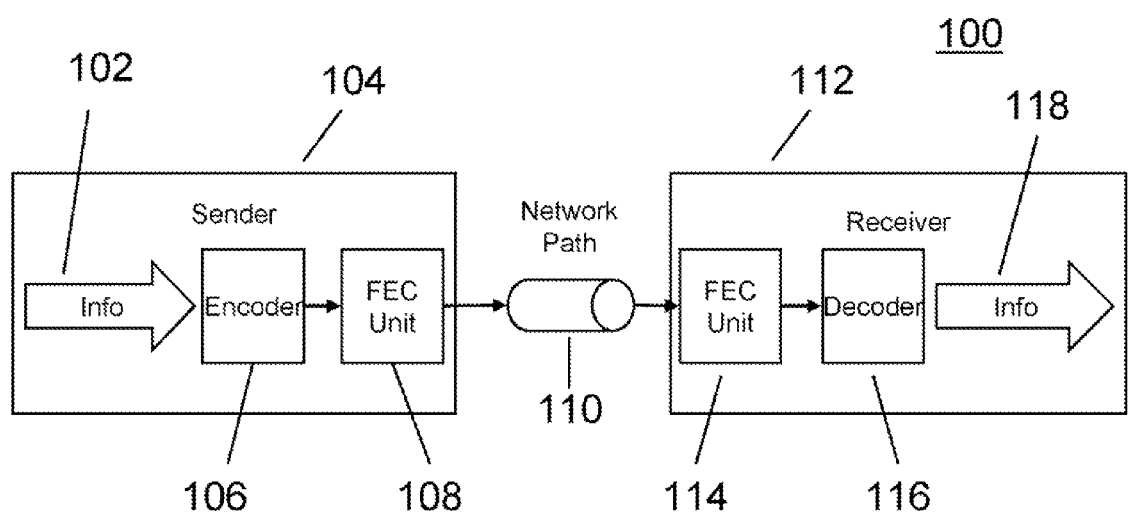
FIG. 1 is a diagram of an example of hardware that can be used in some embodiments.

Turning to FIG. 1, a system 100 in accordance with some embodiments is illustrated. As shown, system 100 can include a sender 104 and a receiver 112 that communicate via a network path 110. Information 102 present at the sender can be transmitted to the receiver where it is made available as information 118, and can be any suitable data, such as information, programs, audio, video, text, images, etc.

Any suitable devices may be used as sender 104 and receiver 112. For example, sender 104 and receiver 112 can be any suitable devices that send and receive data over network path 110, respectively. In addition, in some embodiments, each of sender 104 and receiver 112 can be any suitable devices that are also capable of receiving and sending data, respectively. As a more particularly example, sender 104 and/or receiver 112 can be any of a general purpose computer, a special purpose computer, a telephone, a video phone, a mobile phone, a video conferencing endpoint, a media player, a portable music player, an electronic book, a television, a television set top box, a server, a client, a gateway, a router, a multi-point conferencing unit, a video conferencing server, instant messaging server, email server, streaming server, media server, etc. Any of these examples of sender 104 and receiver 112 can include a processing device (such as a microprocessor, a hardware controller, a digital signal processor, a digital processing device, etc.), memory devices (such as random access memory, read only memory, flash memory, disk drives, optical drives, etc.), interface devices (such as network interface cards, wireless interfaces (e.g., IEEE 802.11 interfaces), optical interfaces, etc.), keyboards, mice, displays, etc. As also shown in FIG. 1, sender 104 can also include an encoder 106 and a forward error correction (FEC) unit 108. Encoder 106 can be any suitable software encoder and/or hardware encoder for encoding information 102 and controlling the transmission of data on the network path. For example, encoder 106 can be an encoder that encodes data in accordance with the H.264 standard or any other standard audio/video codec. FEC unit 108 can be any suitable software FEC unit and/or hardware FEC unit for creating FEC data based on information 102 encoded by encoder 106. For example, FEC unit 108 can be an FEC unit that creates forward error correction data in accordance with the XOR or Reed-Solomon error correction methods. Similarly, receiver 112 can also include an FEC unit 114 and a decoder 116. FEC unit 114 can be any suitable software FEC unit and/or hardware FEC unit for receiving FEC packets from FEC unit 108. Decoder 116 can be any suitable software decoder and/or hardware decoder for decoding information encoded by encoder 102 into information 118.

Network 110 can be any suitable communication network or combination of networks. For example, network 110 can include the Internet, local area networks, wired networks, wireless networks, telephone networks, cable television networks, satellite networks, mobile telephone networks, pager networks, MPLS connections, ISDN networks, etc.

Figure 2:
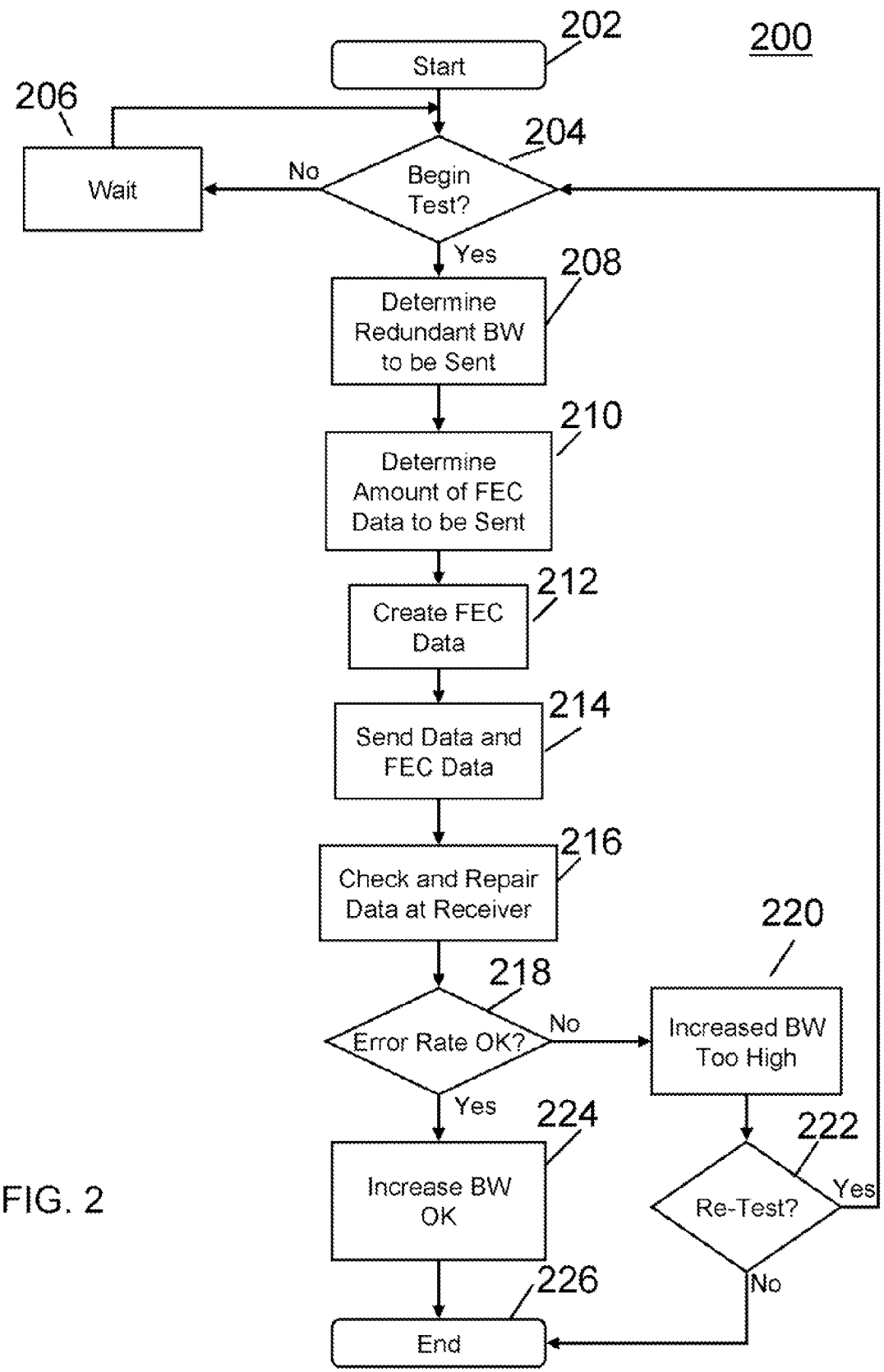
FIG. 2 is a diagram of an example of a process that can be used in some embodiments.

FIG. 2 illustrates an example of a process 200 for checking available bandwidth using forward error correction (FEC) in accordance with some embodiments. As shown, after process 200 begins at 202, the process can determine whether to begin the test at 204. Any suitable criteria or criterion for determining whether to start the test can be used. For example, the test can be started when it is determined that an increase in bandwidth usage would improve performance of the sender, the receiver, or a device coupled thereto. As another example, the test can be started periodically. If it is determined at 204 that the test should not begin, the process 200 can branch to 206 to wait for a period of time and then re-determine whether to begin the test at 204.

If it is determined at 204 that the test is to be started, then process 200 can next determine an amount of redundant bandwidth to be sent at 208. As described above, this redundant bandwidth can be used to check whether there is available bandwidth as well as recover data if the limits in bandwidth (or any other conditions) cause data loss. For example, the amount of redundant bandwidth can be calculated as follows in some embodiments:

$$RB=TB-CB,$$

where:
  RB is the redundant bandwidth;
  TB is the bandwidth to be tested; and
  CB is the current bandwidth being used.
This determination can be made in any suitable device, such as the sender, the receiver, or a third device not shown.

Next, at 210, the amount of additional FEC data to be sent can be determined. Any suitable mechanism for determining the amount of additional FEC data to be sent can be used. For example, in some embodiments, when a transmission of n packets includes k packets of data as well as n−k FEC packets for data protection, the new number of FEC packets (n−k)' (which includes the original n−k FEC packets as well as the additional FEC packets) to be sent can be computed based on RB, TB, and CB, above, along with the current number of information packets (n) and the current number of FEC packets (n−k) as:

$$(n-k)'=\mathrm{floor}(n*(RB/CB))+(n-k).$$

Although the floor( ) function is used in this example, any other suitable function could alternatively be used, such as ceiling( ), round( ), etc. Similarly, although one example of a technique for determining an amount of additional FEC packets is illustrated above, any suitable technique and/or calculation for making such a determination can be used in some embodiments. This determination can also be made in any suitable device, such as the sender, the receiver, or a third device not shown. If 208 and 210 are performed by a device other than the sender, the value for (n−k)' can be communicated to the sender.

At 212, the FEC data can then be created. Any suitable mechanism for creating the FEC data can be used. For example, (n−k)' FEC packets can be created by an FEC unit 108 as shown in FIG. 1.

The data and the FEC data can next be sent at 214. Any suitable mechanism for sending this data can be used in some embodiments. For example, the data can be sent using any suitable hardware and any suitable protocol. More particularly, in some embodiments the data can be sent by a suitable encoder 106 and the FEC data can be sent by a suitable FEC unit 108.

The data can then be checked at 216 to determine if there were any transmission errors, and repaired/reconstructed as necessary. Any suitable technique for checking and repairing/reconstructing the data can be used. For example, FEC unit 114 can check the data and repair it as necessary in some embodiments.

At 218, it can next be determined whether the error rate resulting from transmitting data at a TB rate would be acceptable. Any suitable criteria or criterion can be used to determine whether the error rate would be acceptable in some embodiments. For example, the error rate can be determined to be acceptable if less than a certain percentage of the data and the FEC data was damaged/dropped. This determination can be made in any suitable device, such as the sender, the receiver, or a third device not shown.

If the error rate is acceptable, then the bandwidth can be increased based on the test at 224. Any suitable mechanism for determining the amount of the increase can be used. For example, in some embodiments, the new amount of bandwidth (NB) can be set to:

$$NB=CB*(((n-k)'+k)/n)$$

This determination can be made in any suitable device, such as the sender, the receiver, or a third device not shown—in the latter two cases, such new bandwidth values can be communicated to the sender. In some embodiments, where the network path (for example, with MPLS lines) between the sender and the receiver has no network problems for the tested bandwidth, the amount of FEC data can be set to zero. Once the bandwidth has been increased, process 200 can terminate at 226.

If the error rate is determined to not be acceptable, however, then in some embodiments it can be determined that the increase is too high at 220. In such case, a lower increase, or no increase, can be used in some embodiments. Process 200 can then determine whether to re-test, and if so, process 200 can loop back to 204. Otherwise, process 200 can terminate at 226.

In some embodiments, any suitable computer readable media can be used for storing instructions for performing the processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting, or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claims which follow. For example, although the embodiments shown in FIGS. 1 and 2 are described as including an encoder and a decoder, in some embodiments, the encoder and decoder can be omitted when not needed. Features of the disclosed embodiments can be combined and rearranged in various ways.

What is claimed is:

1. A system for checking available bandwidth using forward error correction, comprising:
    at least one processor that:
        determines an amount of redundant bandwidth based on an amount of bandwidth to be tested and current bandwidth being used;
        identifies data to be transmitted including additional data based on the amount of redundant bandwidth;
        determines an amount of forward error correction data to be sent to a receiver, the amount of forward error correction data including additional forward error correction data based on the amount of redundant bandwidth;
        creates the forward error correction data based on corresponding data in the data to be transmitted;
        transmits to the receiver the forward error correction data and the corresponding data in the data to be transmitted;
        determines an error level in at least one of the corresponding data and the forward error correction data; and
        when the error level is below a value, increases the amount of bandwidth used in a transmission to the receiver of other data in the data to be transmitted over the amount of bandwidth used in the transmission to the receiver of the corresponding data and decreases the amount of bandwidth used for forward error correction data in the transmission of the other data.

2. The system of claim 1, wherein the corresponding data is sent in packets.

3. The system of claim 1, wherein the at least one processor also transmits other forward error correction data.

4. The system of claim 1, wherein the corresponding data is encoded.

5. The system of claim 1, wherein the amount of the increase in bandwidth used in the transmission of other data is less than or equal to the amount of the decrease in bandwidth used for forward error correction data.

6. The system of claim 1, wherein the at least one processor includes at least two processors, and one of the at least two processors is in a sender and transmits the forward error correction data and the corresponding data in the data to be transmitted, and another of the at least two processors is in a receiver and determines the error level in the at least one of the corresponding data and the forward error correction data.

7. The system of claim 1, wherein the at least one processor includes an encoder and a forward error correction unit.

8. A method for checking available bandwidth using forward error correction, comprising:
    determining an amount of redundant bandwidth based on an amount of bandwidth to be tested and current bandwidth being used;
    identifying data to be transmitted including additional data based on the amount of redundant bandwidth;
    determining an amount of forward error correction data to be sent to a receiver, the amount of forward error correction data including additional forward error correction data based on the amount of redundant bandwidth;
    creating the forward error correction data based on corresponding data in the data to be transmitted;
    transmitting to the receiver the forward error correction data and the corresponding data in the data to be transmitted;
    determining an error level in at least one of the corresponding data and the forward error correction data; and
    when the error level is below a value, increasing the amount of bandwidth used in a transmission to the receiver of other data in the data to be transmitted over the amount of bandwidth used in the transmission to the receiver of the corresponding data and decreasing the amount of bandwidth used for forward error correction data in the transmission of the other data.

9. The method of claim 8, wherein the corresponding data is sent in packets.

10. The method of claim 8, further comprising transmitting other forward error correction data.

11. The method of claim 8, wherein the corresponding data is encoded.

12. The method of claim 8, wherein the amount of the increase in bandwidth used in the transmission of other data is less than or equal to the amount of the decrease in bandwidth used for forward error correction data.

13. The method of claim 8, wherein the forward error correction data and the corresponding data in the data to be transmitted are transmitted by a first processor, and the error level in the at least one of the corresponding data and the forward error correction data is determined by a second processor.

14. A non-transitory computer-readable medium containing computer-executable instructions that, when executed by a processor, cause the processor to perform a method for checking available bandwidth using forward error correction, the method comprising:

determining an amount of redundant bandwidth based on an amount of bandwidth to be tested and current bandwidth being used;

identifying data to be transmitted including additional data based on the amount of redundant bandwidth;

determining an amount of forward error correction data to be sent to a receiver, the amount of forward error correction data including additional forward error correction data based on the amount of redundant bandwidth;

creating the forward error correction data based on corresponding data in the data to be transmitted;

transmitting to the receiver the forward error correction data and the corresponding data in the data to be transmitted;

determining an error level in at least one of the corresponding data and the forward error correction data; and when the error level is below a value, increasing the amount of bandwidth used in a transmission to the receiver of other data in the data to be transmitted over the amount of bandwidth used in the transmission to the receiver of the corresponding data and decreasing the amount of bandwidth used for forward error correction data in the transmission of the other data.

15. The non-transitory medium of claim 14, wherein the corresponding data is sent in packets.

16. The non-transitory medium of claim 14, wherein the method further comprises transmitting other forward error correction data.

17. The non-transitory medium of claim 14, wherein the corresponding data is encoded.

18. The non-transitory medium of claim 14, wherein the amount of the increase in bandwidth used in the transmission of other data is less than or equal to the amount of the decrease in bandwidth used for forward error correction data.

19. The non-transitory medium of claim 14, wherein the forward error correction data and the corresponding data in the data to be transmitted are transmitted by a first processor, and the error level in the at least one of the corresponding data and the forward error correction data is determined by a second processor.

\* \* \* \* \*